United States Patent [19]

Tanaka

[11] Patent Number: 5,315,606
[45] Date of Patent: May 24, 1994

[54] LASER DIODE DRIVING CIRCUIT
[75] Inventor: Haruo Tanaka, Kyoto, Japan
[73] Assignee: Rohm Co., Ltd., Kyoto, Japan
[21] Appl. No.: 997,707
[22] Filed: Jan. 5, 1993
[30] Foreign Application Priority Data Jan. 13, 1992 [JP] Japan .................. 4-003798

[51] Int. Cl.$^5$ ............................... H01S 3/00
[52] U.S. Cl. ............................. 372/38; 372/33
[58] Field of Search ....................... 372/38, 33

[56] References Cited
U.S. PATENT DOCUMENTS

| | | | |
|---|---|---|---|
| 4,243,952 | 1/1981 | Patterson | 372/38 |
| 4,488,305 | 11/1984 | Claverie et al. | 372/38 |
| 4,924,473 | 5/1990 | Burgyan et al. | 372/38 |
| 5,140,175 | 8/1992 | Yagi et al. | 372/38 |

Primary Examiner—Léon Scott, Jr.
Attorney, Agent, or Firm—Nikaido, Marmelstein, Murray & Oram

[57] ABSTRACT

A laser diode driving circuit is provided with a constant current source, a first series circuit connected to the constant current source and including a first switching device and a laser diode, and a second series circuit connected so as to constitute a differential circuit in cooperation with the first series circuit and including a second switching device and an impedance device. The laser diode device is driven by turning on and off the second switching device. As the impedance device, a device is used which causes an impedance of the first series circuit obtained when the first switching device is ON and an impedance of the second series circuit obtained when the second switching device is ON to be substantially the same.

7 Claims, 3 Drawing Sheets

LASER DIODE DRIVING CIRCUIT

BACKGROUND OF THE INVENTION

1. Field of the Invention

The present invention relates to a laser diode driving circuit.

2. Description of the Prior Art

FIG. 1 shows a conventional laser diode driving circuit. Numeral 1 is a constant current source whose one end is connected to a direct current power source line 2. The other end thereof is connected through a differential circuit 3 to a ground line 4. The differential circuit 3 includes a first series circuit 5 and a second series circuit 6. The first series circuit 5 includes a first switching transistor Q1 whose base is provided with a constant voltage E and a laser diode LD connected to the emitter of the transistor Q1.

The second series circuit 6 includes a second switching transistor Q2 whose base is provided with a driving pulse P and a resistor R connected to the emitter of the transistor Q2. The pulse width of the driving pulse P is extremely small. While the pulse P is being outputted, the first switching transistor Q1 is OFF since the second switching transistor Q2 is ON. As a result, the laser diode LD is not ON. While the pulse P is not being outputted, since the second switching transistor Q2 is OFF and the first switching transistor Q1 is ON, the laser diode LD is ON. As a result, laser beams are irradiated.

When the speed of response of the constant current source 1 is lower than that of the differential circuit 3, if a voltage Vop obtained between the anode and cathode of the laser diode when the laser diode LD is ON differs from a voltage V across the resistor R, it is impossible to desirably drive the laser diode LD by means of a pulse. That is, when $V<Vop$, a current $I_2$ which flows when the transistor Q2 is ON is larger than a current $I_1$ which flows when the transistor Q1 is ON; however, when the transistor Q2 is turned off and the transistor Q1 is turned on, the output current from the constant current source 1 does not immediately become the current $I_1$. At first, the current $I_2$ flows, and then, the output current gradually decreases to the current $I_1$.

Conversely, when $V>Vop$, $I_2<I_1$. In this case, when the transistor Q2 is turned off and the transistor Q1 is turned on, the output current of the constant current source 1 gradually increases from $I_2$ to $I_1$. FIG. 2 graphically shows the above increase and decrease of $I_2$. $I_2$ shows the former case, while $I_2'$ shows the latter case.

As described above, the currents which flow through the laser diode LD are not constant, they transiently decrease or increase. Since it is impossible to allow a constant current to flow while the laser diode is ON, it is impossible to drive the laser diode by means of an ideal pulse current waveform.

SUMMARY OF THE INVENTION

An object of the present invention is to provide a laser diode driving circuit with which it is possible to always drive the laser diode by means of a constant current.

In order to achieve the above-mentioned problem, according to the present invention, a laser diode is provided with a constant current source, a first series circuit connected to the constant current source and including a first switching device and a laser diode, and a second series circuit connected so as to constitute a differential circuit in cooperation with the first series circuit and including a second switching device and an impedance device; the laser diode device is driven by turning on and off the second switching device. As the impedance device, a device is used which causes an impedance of the first series circuit obtained when the first switching device is ON and an impedance of the second series circuit obtained when the second switching device is ON to be substantially the same.

With such a feature, since a current which flows from the constant current source when the second switching device is ON and a current which flows from the constant current source when the first switching device is ON are of the same value, a current is constant which flows through the laser diode when the second switching device is turned off and the first switching device is turned on. As a result, uniform laser beams are generated.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
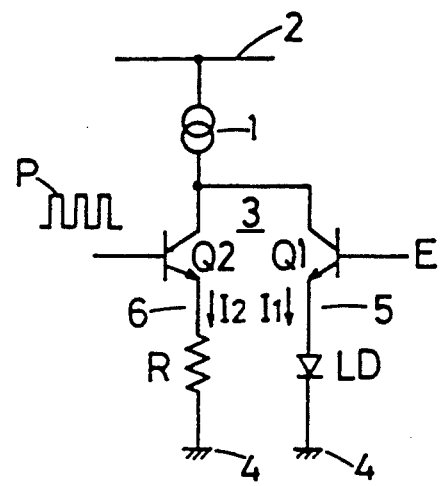
FIG. 1 is a circuit diagram of a conventional laser diode driving circuit.
Figure 2:
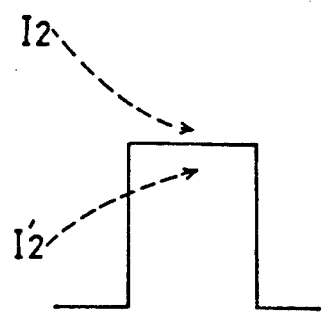
FIG. 2 is a view for explaining a defect of the conventional circuit.
Figure 3:
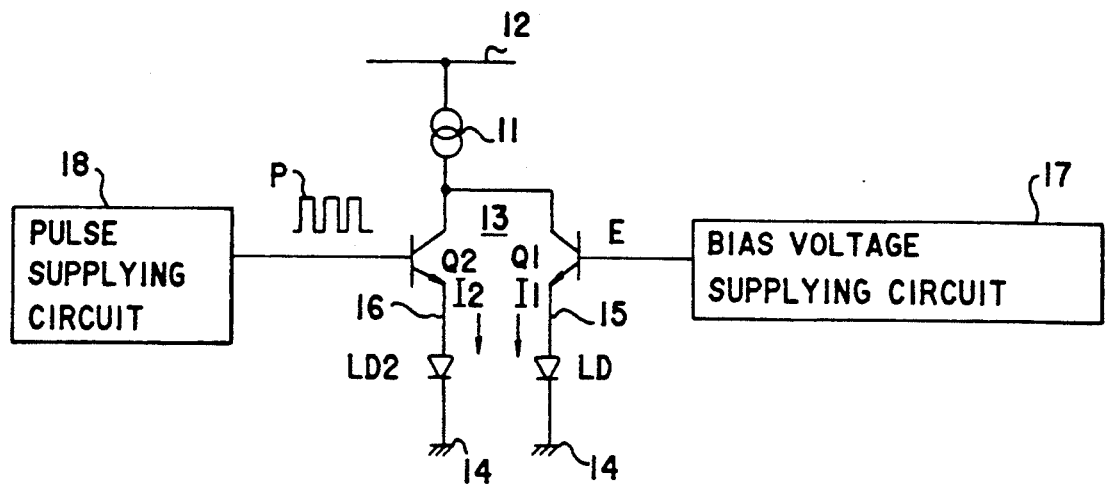
FIG. 3 is a circuit diagram of a first embodiment of the present invention.

FIG. 3 shows a first embodiment of the present invention. Numeral 11 is a constant current source whose one end is connected to a direct current power source line 12. The other end thereof is connected through a differential circuit 13 to a ground line 14. The differential circuit 13 includes a first series circuit 15 and a second series circuit 16. The first series circuit 15 includes a first switching transistor Q1 whose base is provided with a constant voltage E from a bias voltage supplying circuit 17 and a laser diode LD connected to the emitter of the transistor Q1.

The second series circuit 16 includes a second switching transistor Q2 whose base is provided with a driving pulse P from a pulse supplying circuit 18 and a dummy laser diode LD2 connected to the emitter of the transistor Q2. The dummy laser diode LD2 has an I-V (current to voltage) characteristic the same as that of the laser diode LD. However, laser beams emitted by the dummy laser diode LD2 are screened so that laser beams generated by the original laser diode LD are not affected. The pulse width of the driving pulse P is extremely small. While the pulse P is being outputted, the first switching transistor Q1 is OFF since the second switching transistor Q2 is ON. As a result, the laser diode LD is not ON. While the pulse P is not being outputted, since the second switching transistor Q2 is OFF and the first switching transistor Q1 is ON, the laser diode LD is ON. As a result, laser beams are irradiated.

In this circuit, since a current $I_2$ which flows from the constant current source 11 when the second switching transistor Q2 is ON and a current $I_1$ which flows when the first switching transistor Q1 is ON are of the same value, a current which flows through the laser diode LD when the first switching transistor is turned from off to on is always constant. As a result, the laser diode LD can be driven by means of an ideal pulse current waveform.

Figure 4:
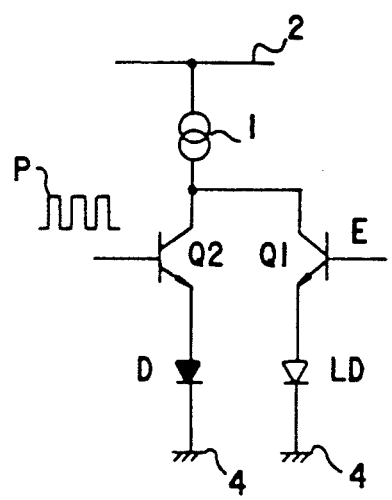
FIG. 4 is a circuit diagram of a second embodiment of the present invention.

FIG. 4 shows an embodiment where a p-n junction device D having an I-V characteristic similar to that of the laser diode LD.

Figure 5:
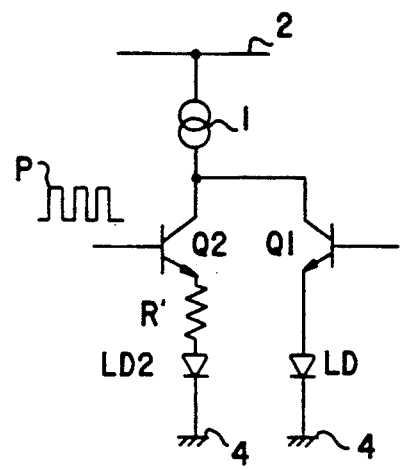
FIG. 5 is a circuit diagram of a third embodiment of the present invention.

When the dummy laser diode LD2 and the p-n junction device D are used as shown in FIGS. 3 and 4, respectively, a resistor R' may be connected, if necessary, as shown in FIG. 5. In that case, the I-V characteristics of the laser diode LD2 and the p-n junction device D do not have to completely correspond to that of the laser diode LD.

Figure 6:
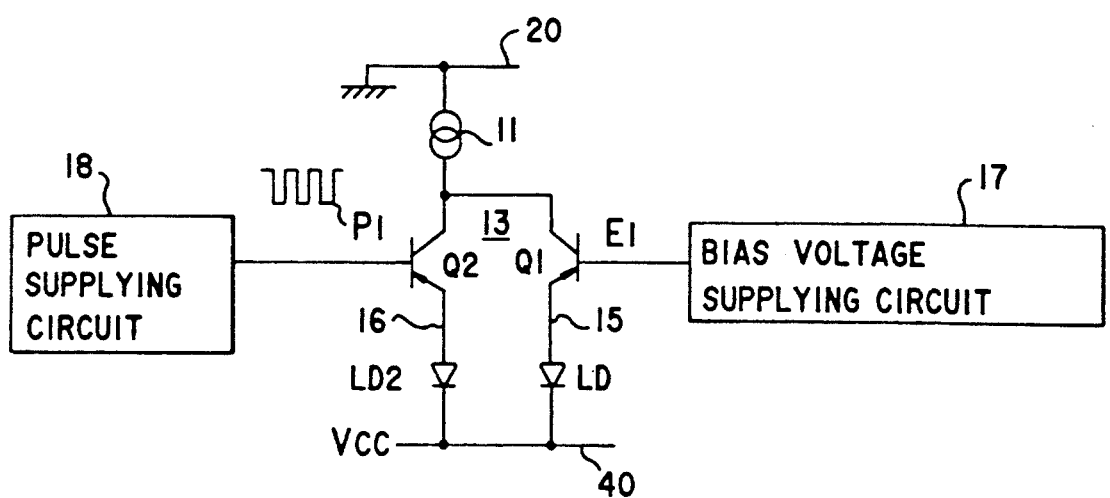
FIG. 6 is a circuit diagram of a fourth embodiment of the present invention.

FIG. 6 shows an embodiment where the first and second switching transistors Q1 and Q2 are constituted by pnp transistors. Numeral 20 is a ground line, and 40 is a line provided with a predetermined positive supply voltage Vcc. In this circuit, the transistor Q2 is ON and the transistor Q1 is OFF during the period when a driving pulse P provided from the pulse supplying circuit 18 is of low level, and the transistor Q2 is OFF and the transistor Q1 is ON during the period when the driving pulse $P_1$ is of high level. To the base of the transistor Q1, a constant voltage $E_1$ is provided from the bias voltage supplying circuit 17. The circuit of FIG. 6 also provides advantages similar to those of the above-described embodiments.

Obviously, many modifications and variations of the present invention are possible in light of the above teachings. It is therefore to be understood that within the scope of the appended claims, the invention may be practiced other than as specifically described.

What is claimed is:

1. A laser diode driving circuit comprising:
a constant current source;
a first series circuit connected to said constant current source, said first series circuit comprising a first switching device and a laser diode connected thereto, said first switching device providing current to said laser diode, and
a second series circuit connected to said constant current source and said first series circuit, thereby forming a differential circuit; said second series circuit comprising a second switching device in series with an impedance device, wherein a switching of said first and second switching devices is controlled based upon a differential between a pulse voltage applied to said second switching device and a bias voltage applied to said first switching device, such that a high level of said pulse voltage is higher than said bias voltage, and a low level of said pulse voltage is lower than said bias voltage,
wherein said impedance device has an impedance which corresponds to an impedance of said laser diode such that an impedance of said first series circuit when said first switching device is ON is substantially the same as an impedance of said second series circuit when said second switching device is ON and wherein said laser diode is turned ON and OFF by the switching of said second switching device, such that when said second switching device is ON said laser diode is OFF, and when said second switching device is OFF, said laser diode is ON, such that uniform and precise laser light is irradiated from said laser diode.

2. A laser diode driving circuit according to claim 1, wherein said circuit element is a dummy laser diode.

3. A laser diode driving circuit according to claim 1, wherein said circuit element is a diode having a current-voltage characteristic substantially the same as that of the laser diode.

4. A laser diode driving circuit according to claim 1, wherein said circuit element comprises a diode and a resistor.

5. A laser diode driving circuit according to claim 1, wherein said first power source line is a line provided with a predetermined positive voltage, said second power source line is a ground line, and said first and second transistors are npn transistors.

6. A laser diode driving circuit according to claim 1, wherein said first power source line is a ground line, said second power source line is a line provided with a predetermined positive voltage, and said first and second transistors are pnp transistors.

7. A laser diode driving circuit comprising:
a constant current source connected to a first power source line;
first and second transistors having collectors connected to an output of the constant current source;
a laser diode connected between an emitter of the first transistor and a second power source line;
a circuit element connected between an emitter of the second transistor and the second power source line, said circuit element having an impedance substantially corresponding to an impedance of the laser diode;
a bias supplying circuit supplying a predetermined bias voltage to a base of the first transistor; and
a pulse supplying circuit supplying a pulse signal to a base of the second transistor, said pulse signal having a low level of pulse which is lower than said bias voltage, and a high level of pulse is higher than said bias voltage, such that a switching of said first and second transistors is controlled by a differential between said pulse voltage and said bias voltage, wherein said first and second transistors are switched ON and OFF by an application of the pulse signal to the base of the second transistor, thereby alternating the laser diode between an ON and an OFF condition such that when said second transistor is switched ON, said first transistor is switched OFF, thereby placing the laser diode in the OFF condition, and wherein when said second transistor is switched OFF, said first transistor is switched ON, thereby placing the laser diode in the ON condition, such that uniform and precise laser light is irradiated from said laser diode.

* * * * *